United States Patent
Andrews et al.

(10) Patent No.: US 6,873,187 B1
(45) Date of Patent: Mar. 29, 2005

(54) METHOD AND APPARATUS FOR CONTROLLING SIGNAL DISTRIBUTION IN AN ELECTRONIC CIRCUIT

(75) Inventors: William Andrews, Emmaus, PA (US); Barry Britton, Orefield, PA (US); Xiaotao Chen, Macungie, PA (US); John P. Fishburn, Murray Hill, NJ (US); Harold Scholz, Allentown, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 20 days.

(21) Appl. No.: 10/400,705

(22) Filed: Mar. 27, 2003

Related U.S. Application Data

(60) Provisional application No. 60/421,944, filed on Oct. 29, 2002.

(51) Int. Cl.[7] ............................................. H03K 19/00
(52) U.S. Cl. .......................... 326/93; 326/37; 327/276; 327/277; 327/299
(58) Field of Search ............................. 326/93, 94, 96, 326/37–41; 327/158, 115, 117, 182, 183, 176, 291, 270, 299

(56) References Cited

U.S. PATENT DOCUMENTS

| | | | | |
|---|---|---|---|---|
| 5,570,045 | A | * 10/1996 | Erdal et al. | .................... 326/93 |
| 6,239,611 | B1 | * 5/2001 | Matera | ........................ 326/16 |
| 6,255,880 | B1 | * 7/2001 | Nguyen | ........................ 327/277 |
| 6,356,132 | B1 | * 3/2002 | Mastrocola et al. | ......... 327/276 |
| 6,437,713 | B1 | * 8/2002 | Lesea | ........................... 341/78 |
| 6,593,791 | B1 | * 7/2003 | Weintraub | ................... 327/262 |

OTHER PUBLICATIONS

U.S. Appl. No. 09/864,276, filed May 25, 2001, "Signal Distribution Scheme in Field Programmable Gate Array (FPGA) or Field Programmable System Chip (FPSC) Including Cycle Stealing Units."

(Continued)

*Primary Examiner*—Vibol Tan

(57) ABSTRACT

An electronic circuit includes delay selection units each associated with a flip-flop or other circuit element. The delay selection unit for a given one of the circuit elements is coupled between a source of a clock or other signal and a corresponding input of the circuit element, and is controllable to provide one of a number of selectable delays for the signal. One or more of the delay selection units are controlled so as to select a particular one of the selectable delays for each of the units. In an illustrative embodiment, the particular delays may be determined at least in part based on the solution of an integer nonlinear program in which the plurality of delays for a given one of the delay selection units are arranged substantially in a monotonically increasing manner and each of at least a subset of the selectable delays for the given one of the delay selection units is specified by upper and lower bounds on the corresponding delay. The integer nonlinear program comprises a system of monotone difference constraints on finite integer ranges, and is solvable utilizing a modified Bellman-Ford algorithm.

15 Claims, 3 Drawing Sheets

OTHER PUBLICATIONS

R. Bar–Yehuda et al., "Efficient Algorithms for Integer Programs with Two Variables per Constraint," Proceedings of the 7th Annual European Symposium on Algorithms, pp. 1–16, 1999.

D.P. Singh et al., "Constrained Clock Shifting for Field Programmable Gate Arrays," Proc. 10th ACM Int. Symp. on FPGAs, pp. 121–126, 2002.

R.B. Deokar et al., "A Graph–Theoretic Approach to Clock Skew Optimization," Proc. ISCAS, pp. 1.407–1.410, 1994.

A. Vittal et al., "Clock Skew Optimization for Ground Bounce Control," ICCAD, pp. 395–399, 1996.

M.C. Papaefthymiou, "Asymptotically Efficient Retiming Under Setup and Hold Constraints," Proc. ICCAD, pp. 396–401, 1998.

D. Velenis et al., "Demonstration of Speed Enhancements on an Industrial Circuit Through Application of Non–Zero Clock Skew Scheduling," IEEE, pp. 1021–1025, 2001.

N.A. Kurd et al., "A Multigigahertz Clocking Scheme for the Pentium® 4 Microprocessor," IEEE Journal of Solid–State Circuits, vol. 36, No. 11, pp. 1647–1653, 2001.

C.E. Leiserson et al., "Retiming Synchronous Circuitry," Digital Equipment Corp. Systems Research Center, pp. 1–42, 1986.

* cited by examiner

– PRIOR ART –

```
1  for i ← 1 to n do s_i ← u_i 2  do {

3      changed ← FALSE 4      for each constraint B_ij(s_j) ≤ A_ij(s_i) + C_ij 5          if (B_ij(s_j) > A_ij(s_i) + C_ij)

6              if (∃ k s.t. B_ij(k) ≤ A_ij(s_i) + C_ij) {

7                  s_j ← largest such k 8                  changed ← TRUE

9              } else return FALSE

10 } while (changed)

11 return TRUE
```

METHOD AND APPARATUS FOR CONTROLLING SIGNAL DISTRIBUTION IN AN ELECTRONIC CIRCUIT

RELATED APPLICATION(S)

The present application claims the priority of U.S. Provisional Patent Application Ser. No. 60/421,944, filed Oct. 29, 2002 and entitled "Method and Apparatus for Controlling Signal Distribution in an Electronic Circuit."

the present application is related to U.S. patent application Ser. No. 09/864,276, filed May 25, 2001, now U.S. Pat. No. 6,486,705, entitled "Signal Distribution Scheme in Field Programmable Gate Array (FPGA) or Field Programmable System Chip (FPSC) Including Cycle Stealing Units," which is incorporated by reference herein.

TECHNICAL FIELD

The present invention relates generally to the field of electronic circuits, and more particularly to signal distribution techniques for use in programmable logic devices such as FPGAs or FPSCs, application-specific integrated circuits (ASICs), or other electronic circuits.

BACKGROUND

Distribution of clocks, data and other signals is an important aspect of electronic circuit design. For example, in a conventional approach to synchronous circuit design, a designer generally strives to make the clock signal arrive at all memory elements simultaneously. This approach will be described in conjunction with FIG. 1.

FIG. 1 shows a synchronous electronic circuit 100 having three memory elements, namely, D-type edge-triggered flip-flops (FFs) denoted F1, F2 and F3. These memory elements may represent embedded elements of an FPGA, FPSC, ASIC or other type of circuit. The circuit 100 further includes three 1 nanosecond (ns) delay elements 102-1, 102-2 and 102-3 arranged in series between the Q output of F1 and the D input of F2, and a single 1 ns delay element 102-4 between the Q output of F2 and the D input of F3. Elements 104-1 and 104-2 denote respective signal delays $x_1$ and $x_2$ associated with distribution of the clock signal to the respective clock inputs of F1 and F2.

In the circuit 100, if the clock signal arrives at the clock inputs of F1, F2 and F3 at the same time (i.e., $x_1$, $x_2$=0 ns), and if it is assumed for simplicity that both the clock-to-Q time and the setup time of the FFs are 0 ns, the circuit will operate correctly at a clock period of 3 ns. If on the other hand there is a difference in the clock arrival times, a situation commonly referred to as "clock skew," the performance of the circuit may be degraded. For example, if the clock arrives 1 ns earlier at F2 than at F1 (i.e., $x_1$=1 ns, $x_2$=0 ns), then the clock period must be increased to 4 ns to ensure correct operation of the F1 to F2 path.

It is also possible that non-zero clock skew can improve circuit performance. For example, if $x_1$=0 ns and $x_2$=1 ns in the circuit 100, the clock period can be reduced from 3 ns to 2 ns. This is an example of a type of technique commonly referred to as "cycle stealing." In the example, the technique lowers the clock period by transferring cycle time from a path that has a surplus allotment (the F2 to F3 path) to a path with a deficit (the F1 to F2 path) Cycle stealing is also referred to as clock skew optimization, clock skew scheduling, or time stealing. It is typically implemented at a point in a circuit design or configuration process after completion of place and route operations, when the timing of clock and data paths is very accurately known.

In the foregoing example, cycle stealing is implemented on a localized ad hoc basis. However, it is preferable in many applications to optimize the performance of a sequential circuit by manipulating substantially all of its clock delays as variables under the control of a single algorithm. One such algorithm is known as the Bellman-Ford algorithm, and is described in, e.g., T. H. Cormen et al., "Introduction to Algorithms," McGraw-Hill, 1990, and R. B. Deokar et al., "A graph-theoretic approach to clock skew optimization," Proc. ISCAS, pp. 1.407–1.410, 1994, which are incorporated by reference herein.

A problem with these and other conventional implementations of cycle stealing is that in certain circumstances they may fail to provide sufficient performance improvements, particularly for applications involving FPGAs and FPSCs. A need therefore exists for improved cycle stealing techniques which overcome the drawbacks associated with the conventional Bellman-Ford algorithm and other similar algorithms.

SUMMARY

The present invention provides improved cycle stealing techniques which in an illustrative embodiment address one or more of the above-noted drawbacks of the conventional techniques.

In accordance with one aspect of the invention, an electronic circuit includes delay selection units each associated with a flip-flop or other circuit element. The delay selection unit for a given one of the circuit elements is coupled between a source of a clock or other signal and a corresponding input of the circuit element, and is controllable to provide one of a number of selectable delays for the signal as applied to the circuit element. One or more of the delay selection units are controlled so as to select a particular one of the selectable delays for each of the units. In the above-noted illustrative embodiment of the invention, the particular delays are determined at least in part based on the solution of an integer nonlinear program in which the plurality of delays for a given one of the delay selection units are arranged substantially in a monotonically increasing manner and each of at least a subset of the selectable delays for the given one of the delay selection units is specified by an upper bound on the corresponding delay and a lower bound on the corresponding delay. The integer nonlinear program may comprise a system of monotone difference constraints on finite integer ranges, and in this case is solvable utilizing a modified Bellman-Ford algorithm.

In accordance with another aspect of the invention, the particular delays may be determined such that a period of the clock signal is substantially minimized. The monotonically increasing delays associated with an ith delay selection unit may be specified by an index variable $s_i$, which takes on integer values in the range from 1 to $u_i$, where $u_i$ denotes the total number of selectable delays associated with the ith delay selection unit. The upper and lower bounds on the selectable delays of the ith delay selection unit are given by $\bar{x}_i[1], \ldots, \bar{x}_i[u_i]$ and $\underline{x}_i[1], \ldots, \underline{x}_i[u_i]$, respectively, and the integer nonlinear program utilizes these bounds to determine values for each $s_i$ in its range $\{1, \ldots, u_i\}$ that minimize clock signal period subject to one or more specified constraints. The upper and lower bounds are preferably configured such that both $\bar{x}_i[s_i]$ and $\underline{x}_i[s_i]$ are monotonically increasing with respect to $s_i$, that is for each i, $\bar{x}_i[1] < \bar{x}_i[2] < \ldots < \bar{x}_i[u_i]$ and $\underline{x}_i[1] < \underline{x}_i[2] < \ldots < \underline{x}_i[u_i]$.

The invention can be utilized on signal lines other than clock lines, such as data lines and control lines, as well as combinations thereof. For example, at least one of the delay selection units may provide a selectable delay for a data signal of the circuit, while one or more of the other delay selection units provide selectable delays for a clock signal of the circuit.

DETAILED DESCRIPTION

The present invention will be illustrated herein as implemented in an example programmable logic device, namely, an FPGA. It should be understood, however, that the invention does not require the use of the particular circuit configurations of the illustrative embodiments, and is more generally suitable for use in any programmable logic device application or other electronic circuit application in which it is desirable to provide improved circuit performance by controlling distribution of clocks or other signals. For example, the invention can be implemented in an FPSC, an ASIC, or another type of electronic circuit.

In accordance with one aspect of the invention, a model of clock race conditions is utilized to define a system of monotone difference constraints on finite integer ranges. The model of the clock race constraints may be based on circuit simulation measurements of the clock delay lines and static timing analysis of data path delays. The system of monotone difference constraints on finite integer ranges is an integer nonlinear program, but is efficiently solvable by a cycle stealing algorithm in accordance with the invention to find the optimal clock skew, that is, the set of clock delays maximizing clock rate.

Figure 1:
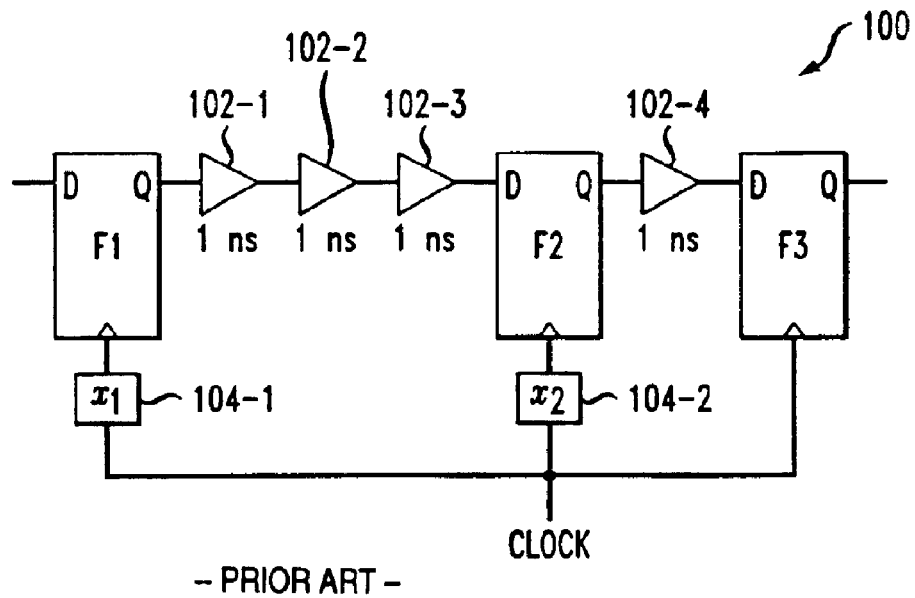
FIG. 1 is a schematic diagram of an electronic circuit used to illustrate a conventional cycle stealing technique.
Figure 2:
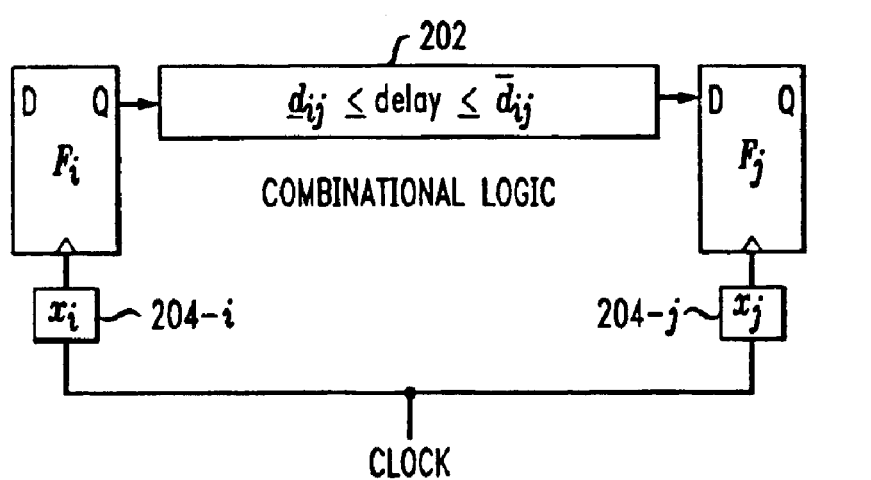
FIG. 2 shows a simplified model for optimizing clock skew in conjunction with a cycle stealing technique in accordance with the invention.

FIG. 2 shows an example of the above-noted model, suitable for use in optimizing clock skew in conjunction with a cycle stealing technique. The model is illustrated herein in the form of a circuit 200 having flip-flops (FFs) $F_1, \ldots, F_n$. When $F_i$ sends a signal through combinational logic 202 to $F_j$, the signal may take more than one path through the logic, but its delay is bounded below by $\underline{d}_{ij}$ and above by $\overline{d}_{ij}$. If there is no path from $F_i$ to $F_j$, $\underline{d}_{ij}=\infty$ and $\overline{d}_{ij}=-\infty$. The clock reaches $F_i$ and $F_j$ after experiencing respective delays of $x_i$ and $x_j$ associated with respective delay elements 204-$i$ and 204-$j$. When a clock signal is delivered to the circuit 200, a race is set in motion between the data signal, which is traveling through the combinational logic 202 from $F_i$ to $F_j$, and the clock signal traveling towards $F_j$. Two of the possible outcomes of this race, double clocking and zero clocking, create problems and should be avoided. The double clocking and zero clocking outcomes will be described in greater detail below.

Double clocking, which is also referred to as the fast data/slow clock race condition, can occur when the clock arrives at the destination FF after the source FF, i.e., when $x_j > x_i$. This creates the possibility that the data signal might arrive at the destination FF before the clock does, destroying the data signal that is present there before it has a chance to be properly clocked through the destination FF. In order to guard against this, a short path constraint may be used. This constraint specifies that no matter how quickly the data signal emerges from $F_i$ and races ahead through the combinational logic 202, it must arrive at $F_j$ no sooner than HOLD amount of time after the clock signal, where HOLD is a safety margin to guarantee correct operation of $F_j$. Thus, the short path constraint may be written as, for all $1 \leq i, j \leq n$:

$$x_i + \underline{d}_{ij} \geq x_j + \text{HOLD}. \tag{1}$$

Zero clocking, which is also referred to as the slow data/fast clock race condition, occurs when clock period P is not long enough to allow the data signal to traverse the path. In order to guard against this, a long path constraint may be used. This constraint specifies that no matter how slowly the data signal traverses a path from $F_i$, it must arrive at $F_j$ no later than SETUP amount of time before the arrival of the next clock signal, where SETUP is a safety margin to guarantee correct operation of $F_j$. Thus, the long path constraint may be written as, for all $1 \leq i, j \leq n$:

$$x_i + \overline{d}_{ij} \leq x_j + P - \text{SETUP} \tag{2}$$

If the clock period P and the clock delays $x_i$ are considered variables, then the problem of minimizing P, while satisfying the constraints (1) and (2) for every pair of FFs i and j, corresponds to the following linear program:

LP_SPEED

Minimize P subject to $$x_j - x_i \leq \underline{d}_{ij} - \text{HOLD}$$

$$x_i - x_j - P \leq -\overline{d}_{ij} - \text{SETUP}$$

for $1 \leq i, j \leq n$.

In this linear program, the conventional approach of zero clock skew with clock period equal to the critical path delay, is merely a feasible point. By contrast, the optimal point, in general, utilizes non-zero clock skew to achieve a clock period that is less than the critical path delay. Intentional clock skew can also generally achieve a higher margin of safety against clock hazards than can zero skew, simply by increasing SETUP and HOLD.

If the clock period P is a constant, LP_SPEED simplifies to become a system of difference constraints, for which an especially efficient solution procedure, the above-noted conventional Bellman-Ford algorithm, is applicable. Let LP_SPEED(X) denote the above linear program with the clock period P fixed at X. The following code performs a binary search for the least value of P for which a satisfying assignment of the $x_l$ can be achieved.

```
BINARY_SEARCH
   Pmin ← 0; Pmax ← critical path delay of circuit;
   while((Pmax − Pmin) > ϵ ){
       P ← (Pmax + Pmin)/2;
       if ∃ an assignment x_i satisfying LP_SPEED(P)
          then Pmax ← P; else Pmin ← P;
   }
```

The conventional Bellman-Ford algorithm can be used in the above BINARY_SEARCH algorithm to decide if there is an assignment to the $x_i$ that satisfies LP_SPEED(P). The input to the Bellman-Ford algorithm is a system of difference constraints, which comprises a set of variables $x_1, \ldots, x_n$ and a set of inequalities $x_j - x_i \leq B_{ij}$ for pairs of indices (i,j). For a fixed value of P, LP_SPEED(P) is clearly of this form. The Bellman-Ford algorithm returns TRUE if and only if there is a satisfying assignment, as illustrated below.

BELLMAN-FORD
for i←1 to n do $x_i$←0;
for i←1 to n-1 do
   for each constraint $x_j \leq x_i + B_{ij}$ do
     if $x_j > x_i + B_{ij}$ then $x_j \leftarrow x_i + B_{ij}$
if any constraint is violated, return FALSE;
return TRUE;

In accordance with the invention, cycle stealing may be implemented in an FPGA or other electronic circuit utilizing per-FF delay selection units that are individually programmable to select one of a finite number of clock delays, and software that analyzes the circuit design to determine the optimal programming of the delay selection units.

The clock may be distributed throughout the circuit by a clock distribution network designed for zero clock skew. This clock is then received by each FF through its corresponding delay selection unit that selects, under the control of field programming bits, one of a number of delay lines, as will be described in conjunction with FIG. 3.

Figures 3, 4:
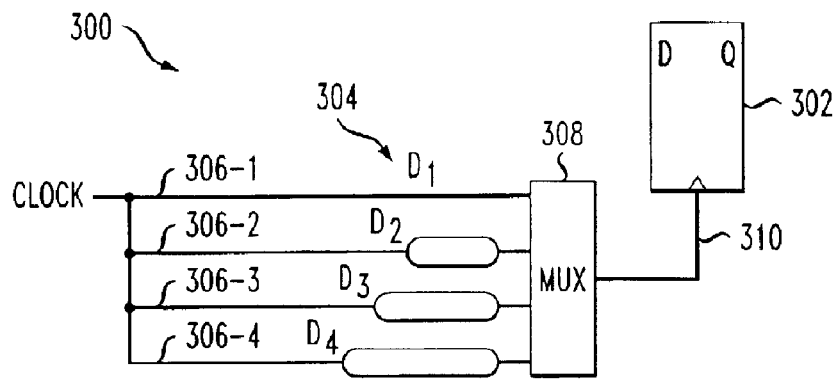
FIG. 3 shows an embedded circuit element and corresponding delay selection unit for providing programmable selection of clock skew in accordance with the invention.
FIG. 4 shows the steps in an example cycle stealing algorithm in accordance with the invention.

FIG. 3 shows a portion of an electronic circuit 300 which includes a single FF 302 and a corresponding delay selection unit 304. The single FF 302 may be viewed as one of many embedded memory elements of an FPGA, FPSC, ASIC or other electronic circuit. The corresponding delay selection unit 304 in this example includes four different delay lines 306-1, 306-2, 306-3 and 306-4, a particular one of which is selected by multiplexer 308 for use in propagating the clock signal to the clock signal input of FF 302 via clock signal line 310. Each of the paths 306-1, 306-2, 306-3 and 306-4 provides a different delay, with these delays being denoted $D_1$, $D_2$, $D_3$ and $D_4$, respectively, in order of increasing delay.

The particular number of delay lines shown in the delay selection unit 304 of FIG. 3 is by way of example only, and other embodiments of the invention can use more or fewer delay lines in a given delay selection unit.

A suitable set of delay lines for a given circuit application may be determined, for example, by analyzing benchmark circuits over various candidate sets. Preferably, the best set is chosen, and a circuit simulation is used to determine upper and lower delay bounds for each of at least a subset of the delay lines. Such analysis and simulation techniques are well-known to those skilled in the art, and are therefore not described in further detail herein.

Additional details regarding delay selection units such as those shown in FIG. 3 as well as other signal distribution techniques suitable for use in conjunction with the present invention may be found in the above-cited U.S. patent application Ser. No. 09/864,276. It is to be appreciated, however, that the present invention does not require any particular configuration of such units.

Relative to the large amount of hardware already needed for lookup tables, routing, and memory elements in an FPGA, the extra per-FF hardware needed to implement the delay selection units is small. A significant performance improvement can therefore be obtained with an insignificant hardware investment.

For an ASIC, static timing analysis and clock tree synthesis suffer from a "chicken-and-egg" problem, that is, the initial static timing analysis must be done prior to the synthesis of whatever mechanism generates the clock skews. Unfortunately, this synthesis then perturbs the layout and thus may invalidate to a certain extent the static timing analysis on which it is based. By contrast, in an FPGA, the layout is typically fixed at the time the device is designed. Circuit simulation based on layout extraction may then be used to calculate, for each delay line, suitable upper and lower bounds on the corresponding delay.

A given user need not use the cycle stealing feature, or even be aware that it exists. For example, if no action is taken with respect to clock skew optimization, all of the delay selection units may automatically default to the same minimum delay, which results in the conventional zero clock skew configuration.

The above-noted software that determines the optimal programming of the delay selection units in the illustrative embodiment will now be described in greater detail. It should initially be noted that in an FPGA, the clock delays generally should be chosen from a discrete set instead of a continuum. Secondly, it is preferable to work not with the nominal delay of each clock delay line, but rather with an upper bound and a lower bound provided by circuit simulation.

This can be modeled by associating with FF $F_i$ the index variable $s_i$, which ranges from 1 to $u_i$ (e.g., in the FIG. 3 configuration, $u_i = 4$). Circuit extraction and simulation may be used to provide upper and lower bounds on the delays of the clock delay lines, where $\overline{x}_i[1], \ldots, \overline{x}_i[u_i]$ (e.g., 0 ns, 0.4 ns, 1.2 ns, 2.8 ns) denote the upper bounds and $\underline{x}_i[1], \ldots, \underline{x}_i[u_i]$ (e.g., 0 ns, 0.38 ns, 1.1 ns, 2.6 ns) are the lower bounds. Preferably, this determination is performed separately for each speed grade of the circuit, so that the difference between $\overline{x}_i$ and $\underline{x}_i$ represents not inter-process variation, but rather the remaining sources of variation such as noise, ground bounce, and inter-FET variation. The optimization problem then is to find values for P and for each $s_i$ in its range $\{1, \ldots, u_i\}$ that solve, for a particular speed grade, the following program:

FPGA_SPEED
Minimize P
subject to $\overline{x}_j[s_j] - \underline{x}_i[s_i] \leq \underline{d}_{ij}$-HOLD
$\overline{x}_i[s_i] - \underline{x}_j[s_j] - P \leq -\overline{d}_{ij}$-SETUP for $1 \leq i, j \leq n$.

As before, FPGA_SPEED(X) is defined to be FPGA_SPEED with the clock period P set to a particular value X. To solve an FPGA_SPEED instance, one may perform a binary search on the smallest value of P for which there are settings of the $s_i$ that satisfy FPGA_SPEED(P). Unfortunately, $\overline{x}_i$ and $\underline{x}_i$ are typically not linear functions of $s_i$, and thus FPGA_SPEED(X) is typically not a linear program, or even an integer linear program. However, this characteristic of $\overline{x}_i$ and $\underline{x}_i$ also provides the freedom to non-uniformly space the nominal delays $D_i$ of FIG. 3. For example, it may be advantageous for $D_i$ to be a geometric, rather than an arithmetic, progression.

In accordance with the present invention, it is sufficient that both $\overline{x}_i[s_i]$ and $\underline{x}_i[s_i]$ be monotone increasing with respect to $s_i$, that is, for each i, $\overline{x}_i[1] < \overline{x}_i[2] < \ldots < \overline{x}_i[u_i]$ and $\underline{x}_i[1] < \underline{x}_i[2] < \ldots < \underline{x}_i[u_i]$. With this easily satisfied condition, which allows nonlinear as well as linear programs, the conventional Bellman-Ford algorithm can be modified to solve the problem efficiently, as will be described below in conjunction with FIG. 4.

The manner in which a system of monotone difference constraints on finite integer ranges can be solved is as follows. It should initially be noted that that a function $f$ is defined to be monotone if $x<y$ implies $f(x)<f(y)$. Suppose the system of constraints is of the form $B_{ij}(s_j)-A_{ij}(s_i) \leq C_{ij}$, for $1 \leq i, j \leq n$, such that each integer variable $s_i$ is restricted to its own range $\{1, \ldots, u_i\}$, $B_{ij}(s_j)$ and $A_{ij}(s_i)$ are monotone functions of their respective arguments $s_j$ and $s_i$, and $C_{ij}$ is either a real number or $\infty$. Such a system is referred to herein as a system of monotone difference constraints on finite integer ranges. For a fixed value of P, FPGA_SPEED(P) is clearly of this form if the assumption is made that the clock delay lines are ordered according to their delays, so that $\overline{x}_i$ and $\underline{x}_i$ are monotone functions of $s_i$.

FIG. 4 illustrates an example algorithm 400 for solving the above-noted system of monotone difference constraints on finite integer ranges. This algorithm is a modification of the conventional Bellman-Ford algorithm. Each $s_i$ is initialized to its maximum value $u_i$. Each constraint $B_{ij}(s_j)-A_{ij}(s_i) \leq C_{ij}$ is examined in turn, and $s_j$ is reduced by the smallest possible amount that will satisfy the constraint. This is repeatedly done until either all constraints are satisfied or some constraint cannot be satisfied in this way.

Like the conventional Bellman-Ford algorithm, the FIG. 4 algorithm "converges from above" to a solution, if one exists. The intuition is that at every instant each $s_j$ is forced to be as small as it is because of a chain of constraints leading back to some $s_i$ still set to its original value $u_i$. The $s_i$ values must therefore stop changing before they "run past" any true solution, at which point they themselves constitute a true solution.

It can be shown that if $(S_1, \ldots, S_n)$ is any satisfying solution to the system of constraints, such that $1 \leq S_i \leq u_i$ for $i=1, \ldots, n$, then the following invariant is true throughout the execution of the FIG. 4 algorithm: $S_1 \leq s_1, \ldots, S_n \leq s_n$. The invariant is true at the beginning of the algorithm because each $s_i$ is initialized to its largest allowed value. It can also be shown that the assignment statement on line 7 of the FIG. 4 algorithm preserves the invariant. Because $(S_1, \ldots, S_n)$ is a satisfying solution, and the invariant is true before the assignment is made, and $A_{ij}(s_i)$ is a monotone function, it must be the case that $$B_{ij}(S_j) \leq A_{ij}(S_i) + C_{ij} \leq A_{ij}(s_i) + C_{ij}.$$

Therefore, there is at least one value in the finite set $1, \ldots, u_j$, namely $S_j$, that is greater than or equal to $S_j$ but can be assigned to $s_j$ so as to satisfy the inequality $B_{ij}(s_j) \leq A_{ij}(s_1) + C_{ij}$. Since the FIG. 4 algorithm assigns to $s_j$ the largest value that satisfies the inequality, the invariant must be preserved.

It can also be shown that the FIG. 4 algorithm is "correct," that is, if there is a satisfying solution to the problem, the algorithm finds some satisfying solution and returns TRUE. Otherwise the algorithm returns FALSE.

This can be shown as follows. Suppose that $(S_1, \ldots, S_n)$ is a satisfying solution to the system of constraints, and suppose the algorithm returns on line 9 with an unsatisfied constraint. Then for that constraint, $B_{ij}(s_j) > A_{ij}(s_1) + C_{ij}$ and yet there is no k such that $B_{ij}(k) \leq A_{ij}(s_i) + C_{ij}$. But this cannot happen because, as noted above, $$B_{ij}(S_j) \leq A_{ij}(S_i) + C_{ij} \leq A_{ij}(s_i) + C_{ij}.$$

Thus when this constraint was considered, $s_j$ could have been assigned the value $S_j$ to satisfy the constraint. On the other hand, suppose there is no satisfying solution. Then as long as the body of the inner if clause is executing, there is some $s_j$ that is being reduced during each iteration of the do loop. But each $s_j$ can only be reduced $u_j-1$ times, and so the algorithm will terminate and return FALSE after at most n * (u−1) iterations of the do loop, where u is the maximum of the $u_i$. The outer do loop therefore cannot be executed more than n * (u−1) times, and the inner for loop is executed once for each constraint. Thus the time complexity of the FIG. 4 algorithm, like the conventional Bellman-Ford algorithm, is polynomial.

The FIG. 4 algorithm, although particularly well suited for implementing clock stealing in an FPGA, can also be used in other types of circuits, such as FPSCs and ASICs. For example, the algorithm is suitable for use in clock scheduling in ASICs, particularly if the set of available delays is discrete due to a finite buffer library or other similar arrangement.

In the case of an FPGA, the FIG. 4 algorithm is preferably implemented so as to operate on a placed and routed circuit to determine the set of clock delays that minimizes clock period. It can be applied separately to each clock domain in a given electronic circuit which includes multiple clock domains.

Figure 5:
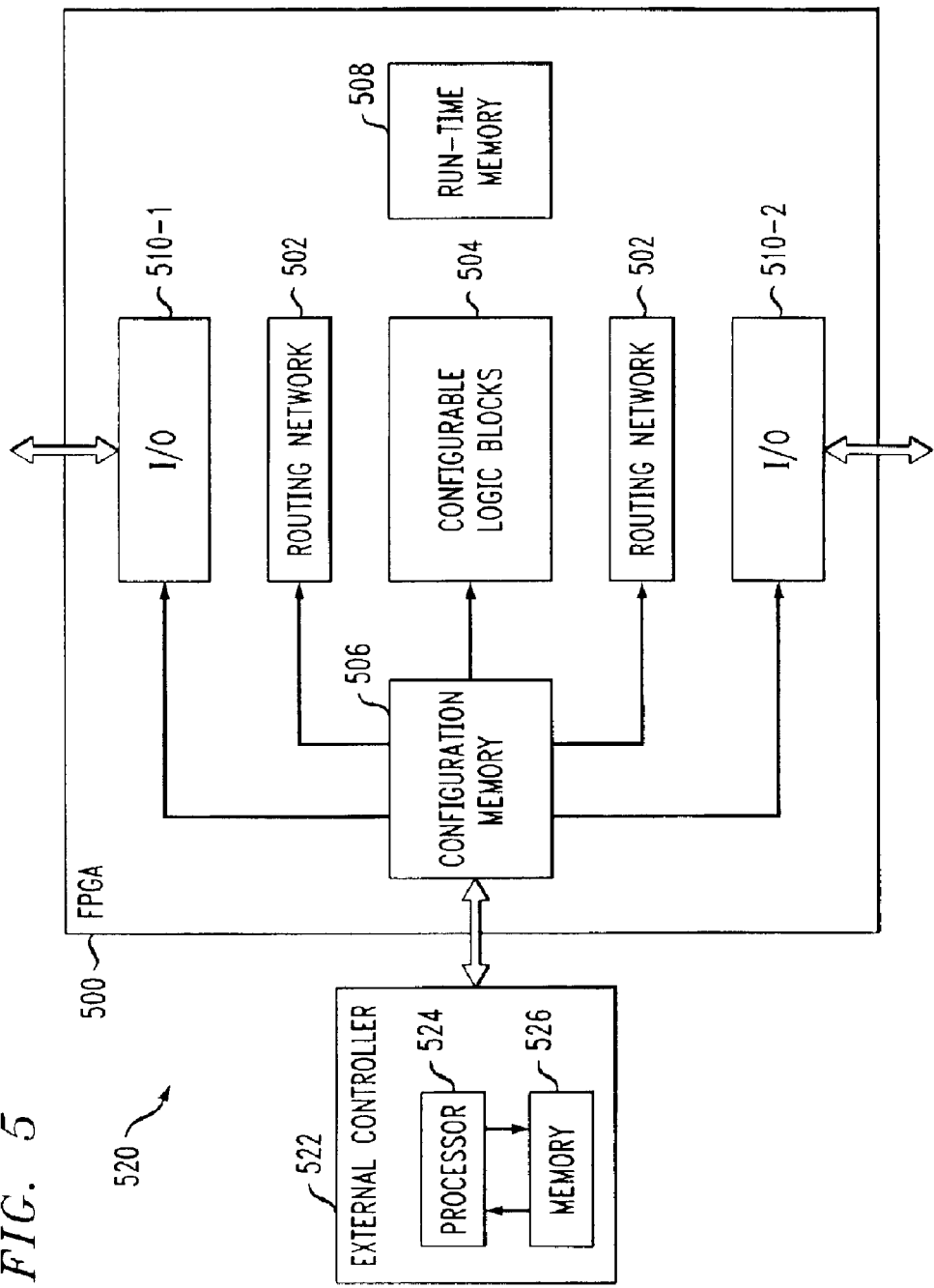
FIG. 5 shows an example processing system comprising an FPGA in which a cycle stealing technique in accordance with the invention is implemented.

FIG. 5 shows an example FPGA 500 in which the invention is implemented. The FPGA 500 includes a routing network 502, configurable logic blocks 504, a configuration memory 506, a run-time memory 508, and a number of input/output (I/O) blocks 510-1, 510-2. The FPGA 500 is illustratively shown as being arranged within a processing system 520 which includes an external controller 522. The configurable logic block 504 and/or other portions of the FPGA 500 include a plurality of FFs or other circuit elements each having an associated delay selection unit of the type shown in FIG. 3.

The FPGA 500 of system 520 may be viewed as an otherwise conventional FPGA incorporating a clock stealing technique in accordance with the invention. Additional details regarding conventional aspects of the operation of the FPGA 500 can be found, e.g., in the above-cited U.S. patent application Ser. No. 09/864,276. However, as indicated previously, the techniques of the invention are not limited to use with this particular electronic circuit or any other circuit.

The external controller 522 of system 500 may comprise a workstation or other computer, and includes a processor 524 coupled to a memory 526. The external controller may include other elements not shown in the figure, including conventional input-output peripherals such as a display, a keyboard, a network interface card, etc. The processor 524 executes software for implementing delay selection techniques in accordance with the invention, and may comprise a microprocessor, central processing unit (CPU), or other processing device, as well as portions or combinations of such devices. The memory 526 stores the software executed by the processor 524, and may comprise electronic memory, magnetic memory, optical memory, or other machine-readable storage media, as well as portions or combinations of such storage media.

Also included within the external controller 522 is interface circuitry (not shown) for interfacing with the FPGA 500. Such interface circuitry, and other elements of the external controller 522, may be configured in a conventional manner.

In operation, the processor 524 of external controller 522 executes software for determining particular delays for use in programming the delay selection units within FPGA 500, using the previously-described techniques of the invention. This software may be stored in the memory 526 of the external controller 522. The resulting delay values are then programmed into or otherwise transferred to the FPGA 500 by the external controller 522.

The software executed by the external controller 522 may comprise, by way of example, software associated with an otherwise conventional circuit design automation tool implemented on the external controller 522 or other processor-based device.

In other embodiments, the particular delays may be determined on a computer or other processor-based device separate from the external controller 522, and then transferred to that controller via a network connection or other transmission medium.

Advantageously, the techniques of the invention can provide a significant increase in the clock speed of a given electronic circuit. Moreover, if configured such that all clock delays can be set to the same value to achieve zero skew, these techniques generally cannot result in a significant decrease in the speed of the circuit.

The techniques of the invention can also be used to reduce ground bounce and to help meet setup and hold constraints on paths leading outside the circuit.

With regard to ground bounce reduction, the power and ground lines of a synchronous circuit tend to exhibit IR and L·dI/dt voltage fluctuations synchronized to the clock. Zero clock skew exacerbates this problem, because it superimposes in time the I and dI/dt characteristics of the FFs and first levels of logic. A welcome side effect of non-zero clock skew for cycle stealing is a reduction in ground bounce due to the staggering of FF firing times. When large loads are driven, as in output pad drivers fed by FFs, it may be desirable to assign different clock delays to different FFs in an output group, e.g., using the previously-described clock delay selection mechanism of FIG. 3. This tends to be preferable to slower slew rates because delays are more predictable, and it allows critical outputs to be sent first.

A clock delay selection mechanism such as that shown in FIG. 3 can also be used to meet setup and hold constraints on paths leading outside the circuit. For example, paths leading outside an FPGA or other circuit may be excluded from the above-described optimizations, but may be separately tuned by manually setting the clock delay of a FF in a programmable I/O (PIO) unit. As a more particular example, suppose that an output path is unable to meet its setup requirement at its external destination FF. A phase lock loop (PLL) or other clock source can be set to deliver an earlier clock to the source FF of this path, and the clock delay of the input FF in the same PIO unit can be set to a higher value to achieve the desired setup for a path coming into it from outside. This technique was generally not possible prior to clock skew optimization, because both FFs in the PIO unit were served by the same clock edge from the PLL.

The above-described embodiments of the invention are intended to be illustrative only, and numerous alternative embodiments within the scope of the appended claims will be apparent to those skilled in the art. For example, although the illustrative embodiments deal with determining appropriate selectable delays for clock signals, the invention is not restricted to use with clock signals, and can be used, e.g., to determine appropriate delays for data signals, for control signals, or for various combinations of clock, data and control signals. Delay selection mechanisms such as that shown in FIG. 3 can thus be implemented for data lines in a given circuit, for control lines, or for combinations of data, control and clock lines, as well as or alternatively for other signal lines of the circuit. The particular number of delay lines utilized in a given delay selection unit can also be varied. In addition, although illustrated using flip-flops as embedded circuit elements, the invention can be applied other types of circuit elements sensitive to signal timing. Furthermore, although the illustrative embodiments utilize an integer nonlinear program comprising a system of monotone difference constraints on finite integer ranges, the invention can be implemented using other types of programs, such as, e.g., an integer linear program.

What is claimed is:

1. A method for controlling distribution of at least one signal in an electronic circuit comprising a plurality of circuit elements, the method comprising:

providing a delay selection unit for each of at least a subset of the circuit elements, the delay selection unit for a given one of the circuit elements being coupled between a source of the signal and a corresponding input of the circuit element and being controllable to provide one of a plurality of selectable delays for the signal; and controlling one or more of the delay selection units so as to select a particular one of the selectable delays for each of the one or more units, the particular delays being determined at least in part based on a program in which the plurality of delays for a given one of the delay selection units are arranged substantially in a monotonically increasing manner and each of at least a subset of the selectable delays for the given one of the delay selection units is specified by an upper bound on the corresponding delay and a lower bound on the corresponding delay, wherein the electronic circuit comprises a programmable logic device and wherein the program comprises an integer linear program.

2. The method of claim 1 wherein the at least one signal comprises a dock signal.

3. The method of claim 2 wherein the particular delays are determined such that a dock period of the clock signal is substantially minimized.

4. The method of claim 1 wherein the at least one signal comprises at least one of a data signal, a clock signal and a control signal.

5. A method for controlling distribution of at least one signal in an electronic circuit comprising a plurality of circuit elements, the method comprising:

providing a delay selection unit for each of at least a subset of the circuit elements, the delay selection unit for a given one of the circuit elements being coupled between a sources of the signal and a corresponding input of the circuit element and being controllable to provide one of a plurality of selectable delays for the signal; and controlling one or more of the delay selection units so as to select a particular one of the selectable delays for each of the one or more units, the particular delays being determined at least in part based on a program in which the plurality of delays for a given one of the delay selection units are arranged substantially in a monotonically increasing manner and each of at least a subset of the selectable delays for the given one of the delay selection units is specified by an upper bound on the corresponding delay and a lower bound on the corresponding delay.

wherein the electronic circuit comprises a programmable logic device and wherein the program comprises an integer nonlinear program.

6. A method for controlling distribution of at least one signal in an electronic circuit comprising a plurality of circuit elements, the method comprising:

providing a delay selection unit for each of at least a subset of the circuit elements, the delay selection unit for a given one of the circuit elements being coupled between a source of the signal and a corresponding input of the circuit element and being controllable to provide one of a plurality of selectable delays for the signal; and controlling one or more of the delay selection units so as to select a particular one of the selectable delays for each of the one or more units, the particular delays being determined at least in part based on a program in which the plurality of delay for a given one of the delay selection units are arranged substantially in a monotonically increasing manner and each of at least a subset of the selectable delays for the given one of the delay selection units is specified by an upper bound on the corresponding delay and a lower bound on the corresponding delay, wherein the electronic circuit comprises a programmable logic device and wherein at least one of the delay selection units provides a selectable delay for a data signal of the circuit, and at least one of the delay selection units provides a selectable delay for a clock signal of the circuit.

7. The method of claim 6 wherein the program comprises a system of monotone difference constraints on finite integer ranges.

8. The method of claim 6 wherein at least a subset of the plurality of circuit elements comprise flip-flops.

9. The method of claim 6 wherein a given one of the delay selection units comprises a plurality of parallel delay lines each connected to a corresponding input of a multiplexer, the multiplexer having an output coupled to the corresponding input of the circuit element, the multiplexer being operative to select a given one of the selectable delays provided by the delay selection unit by selecting one of its inputs for propagation to its output.

10. The method of claim 9 wherein the plurality of delay lines includes at least a first delay line providing a minimal delay, and two or more additional delay lines providing increasing amounts of delay.

11. The method of claim 10 wherein a substantially zero skew arrangement is implemented in the circuit by selection in each of the plurality of delay selection units of a first delay line providing a minimal delay.

12. The method of claim 6 wherein the monotonically increasing delays associated with an $\lambda$h delay selection unit are specified by an index variable $s_1$, which takes on integer values in the range from 1 to $u_i$, where $u_i$ denotes the total number of selectable delays associated with the $\lambda$h delay selection unit.

13. The method of claim 12 wherein the upper and lower bounds on the selectable delays of the $\lambda$h delay selection unit are given by $\bar{x}_i[1], \ldots, \bar{x}_i[u_i]$ and $\underline{x}_i[1], \ldots, \underline{x}_i[u_i]$, respectively, and the program utilizes these bounds to determine values for each $s_1$ in its range $\{1, \ldots, u_i\}$ that minimize clock signal period subject to one or more specified constraints.

14. The method of claim 13 wherein both $\bar{x}_i[s_i]$ and $\underline{x}_i[s_i]$ are monotonically increasing with respect to $s_i$, that is, for each i, $\bar{x}_i[1] < \bar{x}_i[2] < \ldots < \bar{x}_i[u_i]$ and $\underline{x}_i[1] < \underline{x}_i[2] < \ldots < \underline{x}_i[u_i]$.

15. A method for controlling distribution of at least one signal in an electronic circuit comprising a plurality of circuit elements, the method comprising;

providing a delay selection unit for each of at least a subset of the circuit elements, the delay selection unit for a given one of the circuit elements being coupled between a source of the signal and a corresponding input of the circuit element and being controllable to provide one of a plurality of selectable delays for the signal; and controlling one or more of the delay selection units so as to select a particular one of the selectable delays for each of the one or more units, the particular delays being determined at least in part based on a program in which the plurality of delays for a given one of the delay selection units are arranged substantially in a monotonically increasing manner and each of at least a subset of the selectable delays for the given one of the delay selection units is specified by an upper bound on the corresponding delay and a lower bound on the corresponding delay, wherein the program is solvable utilizing a modified Bellman-Ford algorithm.

* * * * *

UNITED STATES PATENT AND TRADEMARK OFFICE
CERTIFICATE OF CORRECTION

PATENT NO. : 6,873,187 B1
DATED : March 29, 2005
INVENTOR(S) : William Andrews et al.

It is certified that error appears in the above-identified patent and that said Letters Patent is hereby corrected as shown below:

Column 10,
Line 33, "dock signal" should read -- clock signal --.
Line 35, "dock period" should read -- clock period --.
Line 46, "sources of the signal" should read -- source of the signal --.

Column 11,
Line 12, "plurality of delay" should read -- plurality of delays --.

Signed and Sealed this

Thirtieth Day of August, 2005

JON W. DUDAS
*Director of the United States Patent and Trademark Office*